United States Patent
Criniti et al.

(10) Patent No.: US 6,456,061 B1
(45) Date of Patent: Sep. 24, 2002

(54) CALIBRATED CURRENT SENSOR

(75) Inventors: Joseph Criniti, New Britain; Javier Ignacio Larranaga, Bristol; Farshid Attarian, Canton; Alberto Anibal Figueroa, Southington, all of CT (US)

(73) Assignee: General Electric Company, Schenectady, NY (US)

( * ) Notice: Subject to any disclaimer, the term of this patent is extended or adjusted under 35 U.S.C. 154(b) by 39 days.

(21) Appl. No.: 09/717,609

(22) Filed: Nov. 21, 2000

(51) Int. Cl.$^7$ .................................................. G01R 1/14
(52) U.S. Cl. ...................................................... 324/127
(58) Field of Search ........................ 324/76.11, 117 R, 324/117 H, 126, 127; 323/357; 336/55, 82, 84 R; 338/49

(56) References Cited

U.S. PATENT DOCUMENTS

| | | | | |
|---|---|---|---|---|
| 4,182,982 A | * | 1/1980 | Wolf et al. ................. | 324/127 |
| 4,492,919 A | * | 1/1985 | Milkovic .................... | 324/127 |
| 4,496,932 A | * | 1/1985 | Halder ........................ | 338/49 |
| 4,749,940 A | * | 6/1988 | Bullock ...................... | 324/127 |
| 4,939,451 A | * | 7/1990 | Baran et al. ................ | 324/127 |
| 5,066,904 A | * | 11/1991 | Bullock ...................... | 324/127 |
| 5,841,272 A | * | 11/1998 | Smith et al. ............ | 324/117 H |

* cited by examiner

*Primary Examiner*—N. Le
*Assistant Examiner*—Etienne P LeRoux
(74) *Attorney, Agent, or Firm*—Cantor Colburn LLP

(57) ABSTRACT

A method permits calibration of a current sensor having a conductor that comprises at least two conductor branches electrically connected in parallel. The method comprises passing a predetermined electrical current through the conductor, measuring a fraction of the current that passes through a measured conductor branch, which is one of the two conductor branches, comparing the measured current against a predetermined target current, trimming a calibrating conductor, which is one of the at least two conductor branches, the trimming taking place when said measured current and said predetermined target current are not equal.

23 Claims, 3 Drawing Sheets

CALIBRATED CURRENT SENSOR

BACKGROUND OF THE INVENTION

The present invention relates generally to sensing electrical current on a current path, and more specifically, to calibrating a current sensor by trimming target surfaces along the current path.

Many products require sensing electrical current in a current path to provide the necessary input for electronic control devices. The accuracy of the current sensing and current measurements may be affected by variations in resistance at the current path, variations at jointed areas, even material changes in grade and density of the conductor material. The sensor itself may introduce errors contributing to inaccuracies. For example, when using a current transformer (CT), inherent variations from one CT to another can affect the transformer's accuracy. Consequently, variations with respect to different CTs necessitate setting tolerance parameters to accommodate these variations.

In circuit breaker applications, the current is measured by installing a CT that is directly affected by the current flow through the conductor. The electrical current may be measured by passing only a portion of the current through the CT or by passing all of the current through the CT. A portion of the current may be measured as representative of the whole current. To measure a portion of the current, a current bridge or current divider may be used.

Current dividers and current bridges enable one to determine the magnitude of a large current by dividing the current into parallel flows, and measuring only a fraction of the total current, i.e., by measuring the current through one branch of the conductor. The current measurement is then divided by the fraction of current through that conductor branch to determine the total current in all parallel conductor branches.

Current dividers are a useful means of measuring a large current or current through large conductors, however they have not greatly overcome the inherent inaccuracies of current sensors discussed above.

Therefore, it is desirable to calibrate current sensors to overcome the manufacturing variations in conductors, sensors, and associated electronics.

SUMMARY OF THE INVENTION

The above discussed and other drawbacks and deficiencies are overcome or alleviated by a method for calibrating a current sensor having a conductor that comprises at least two conductor branches electrically connected in parallel. The method comprises passing a predetermined electrical current through the conductor, measuring a fraction of the current that passes through a measured conductor branch, which is one of the two conductor branches, comparing the measured current against a predetermined target current, trimming a calibrating conductor, which is one of the at least two conductor branches, the trimming taking place when said measured current and said predetermined target current are not equal.

BRIEF DESCRIPTION OF THE DRAWINGS

Referring now to the drawings, wherein like elements are numbered alike in the several figures.

DETAILED DESCRIPTION OF THE INVENTION

In the present invention, a conductor is divided into at least two branches, and the current in one branch is measured to determine the fraction of the total current in that branch. One of the branches is then trimmed by removing a portion of the conductor material until the fraction of current in the branch being monitored reaches a target. This method is useful in calibrating the amount of trimming necessary to provide the target amperage, as well as providing a means to achieve the desired trimming.

Figure 1:
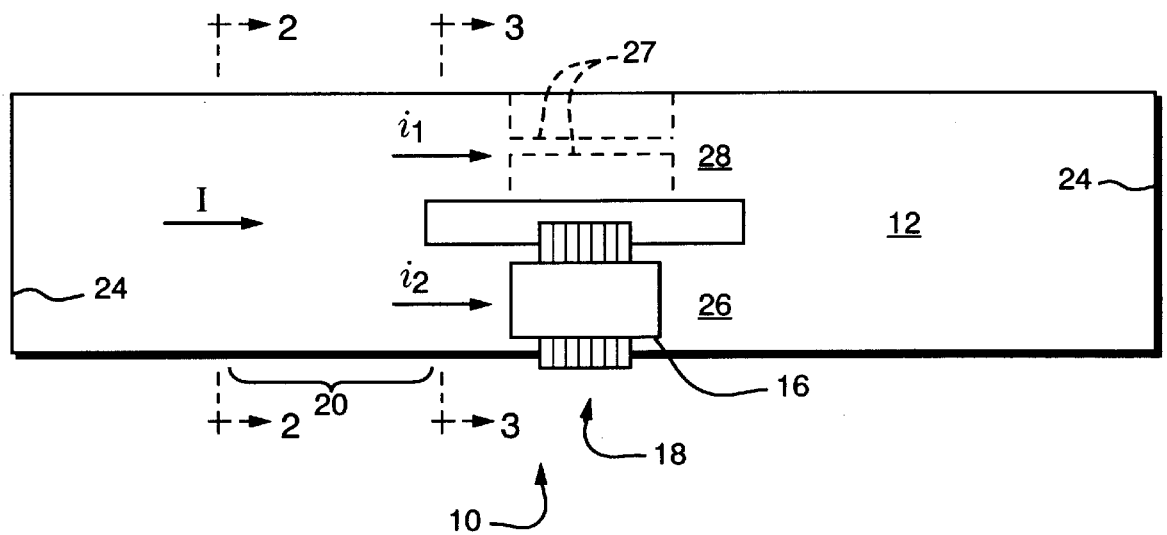
FIG. 1 is the top view representation of a first embodiment of a current sensor configuration.

FIG. 1 shows a top view of a current sensor-conductor assembly 10, which includes conductor 12 comprising conductor branches 26 and 28. Conductor 12 extends between opposite terminal ends 24, and may be placed in a power distribution circuit or electric device such as a circuit breaker. For example, terminal conductor 12 may be connected between load and power line straps in a circuit breaker to provide current sensing capability therein. Branch conductors 26 and 28 are electrically connected in parallel. A current sensor 18 is fixed at a predetermined point on the conductor branch 26, hereinafter referred to as a "measured conductor branch" because the current therein is measured by current sensor 18. Current sensor 18 is shown as a current transformer, but may be any type of current sensor, such as a Hall-effect sensor. The current passing through measured conductor branch 26 causes a resultant voltage in secondary windings 16, and the output thereof is measured.

Figure 2:
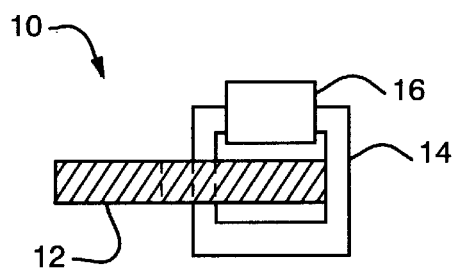
FIGS. 2 and 3 are first and second cross section views of the current sensor configuration of FIG. 1.
Figure 3:
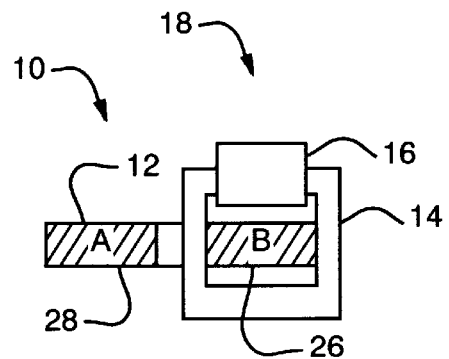

FIGS. 2 and 3 show cross section views of the current sensor-conductor assembly 10 taken along lines 2—2 and 3—3, respectively. Referring to conductor branch 28 by the subscript "A" and measured conductor branch 26 by the subscript "B," the relationship between the currents flowing in the respective conductor branches depends on cross-section areas A and B (FIG. 3) of conductor branch 28 and measured conductor branch 26, respectively, as will now be explained in detail.

The currents paths may be described using Kirchhoff's current law, which states that the total current entering a node is equal to the total current leaving that node. Referring to FIG. 1, the current I represented by arrow 32 entering node 20 is equal to sum of current $i_A$ in conductor branch 28 and current $i_B$ in conductor branch 26, represented mathematically as:

$$I = i_A + i_B. \tag{1}$$

Because measured conductor branch 26 and conductor branch 28 are connected in parallel, they have the same or virtually the same voltage across them. Since the voltage across both conductor branches is the same, the fraction of the total current I passing through measured conductor branch 26 depends upon its resistance compared with resistance in conductor branch 28. Because $v_A = v_B$ and voltage = current times resistance (V=IR), $$i_A r_A = i_B r_B. \tag{2}$$

Solving for $i_A$ gives:

$$i_A = i_B \frac{r_B}{r_A}. \quad (3)$$

Resistance, r, is given by $$r = \rho \frac{l}{A} \quad (4)$$

where $\rho$=resistivity, l=length of the conductor, and A=the cross-section area of the conductor. Substituting Equation 4 for $r_A$ and $r_B$ in Equation 3 above gives:

$$i_A = i_B \frac{\rho_B \frac{l_B}{A_B}}{\rho_A \frac{l_A}{A_A}} \equiv i_B \frac{\rho_B l_B A_A}{\rho_A l_A A_B}. \quad (5)$$

Assuming the resistivity and lengths of conductor branch 28 and measured conductor branch 26 are substantially the same, these values may be canceled. The trimming process discussed below can compensate for actual differences in the lengths and material resistivity. For configurations where there are great differences in material, lengths, etc., the equal signs in the following equations can be replaced with proportionalities since the materials and lengths of the conductor branches are constant. Canceling gives:

$$i_A = i_B \frac{A_A}{A_B}. \quad (6)$$

Because $i_A = I - i_B$ (from Equation 1), $$I - i_B = i_B \frac{A_A}{A_B}, \text{ or} \quad (7)$$

$$I = i_B \left(1 + \frac{A_A}{A_B}\right) \text{ or} \quad (8)$$

$$i_B = I \frac{A_B}{A_B + A_A}. \quad (9)$$

Thus, it can be seen that the measured current $i_B$ depends at least in part on the total current and the cross-section areas of the conductor branches.

The present invention may be adapted to accommodate a system having any number of conductors by combining a variety of current dividers in relationship with one another. Additionally, the foregoing description of conductor 12 is provided as an illustration and is not intended as a limitation. It is anticipated that current dividers of other configurations may be devised that fall within the scope of the present invention.

Figure 4:
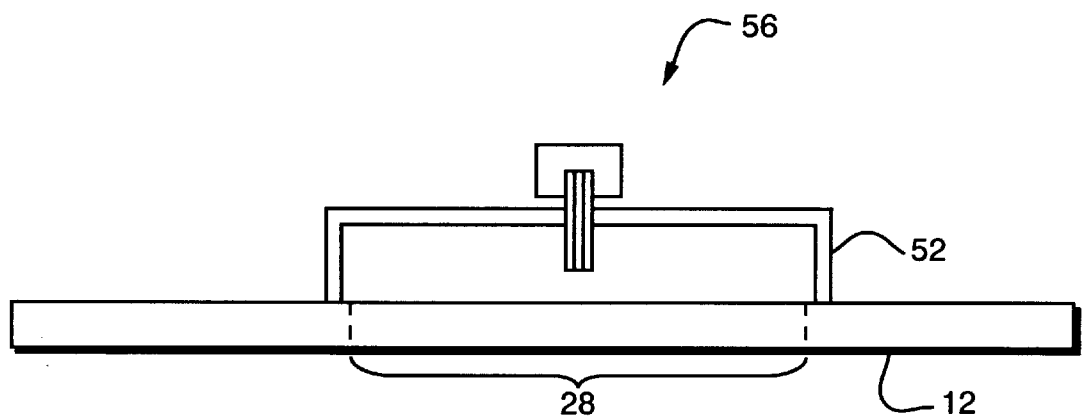
FIGS. 4 and 5 are profile and plan views, respectively, of a second embodiment of a current sensor configuration representation of a current transformer-conductor utilizing a bridge.
Figure 5:
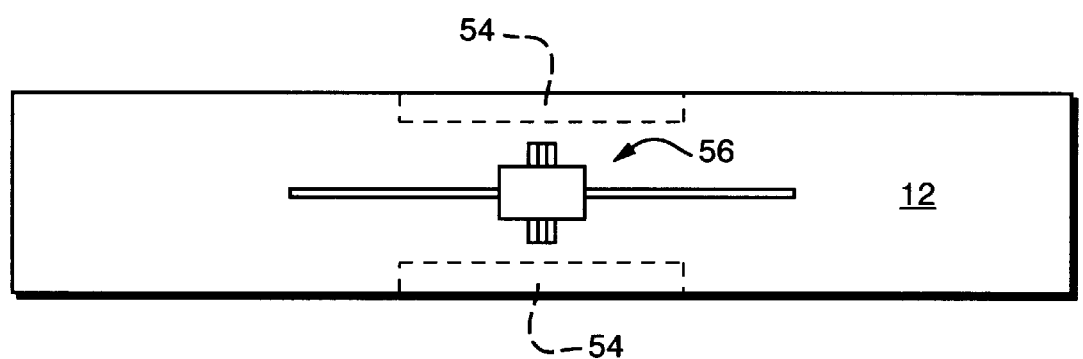

For example, FIGS. 4 and 5 illustrate a profile and top view, respectively, of another embodiment. This embodiment differs from the previous embodiment shown in FIGS. 1 through 3 in that the conductor 12 is not split. Instead, this embodiment has a measured conductor branch formed from as bridge-CT assembly 56 that allows a fraction of the total current to travel through it.

To compensate for manufacturing variances in the conductor and sensing circuitry, one of the conductor branches, hereinafter referred to as a "calibrating conductor branch," is trimmed by selectively removing some of the conductor material, thereby varying the cross section area of one conductor branch and adjusting the ratio of current passing through each branch as generally described in Equations 8 and 9 above. In one embodiment (not shown), the measured conductor branch is the same conductor branch as the calibrating conductor branch. In the embodiments shown in FIGS. 1–4, the measured conductor branch is distinct from the calibrated conductor branch.

Figure 6:
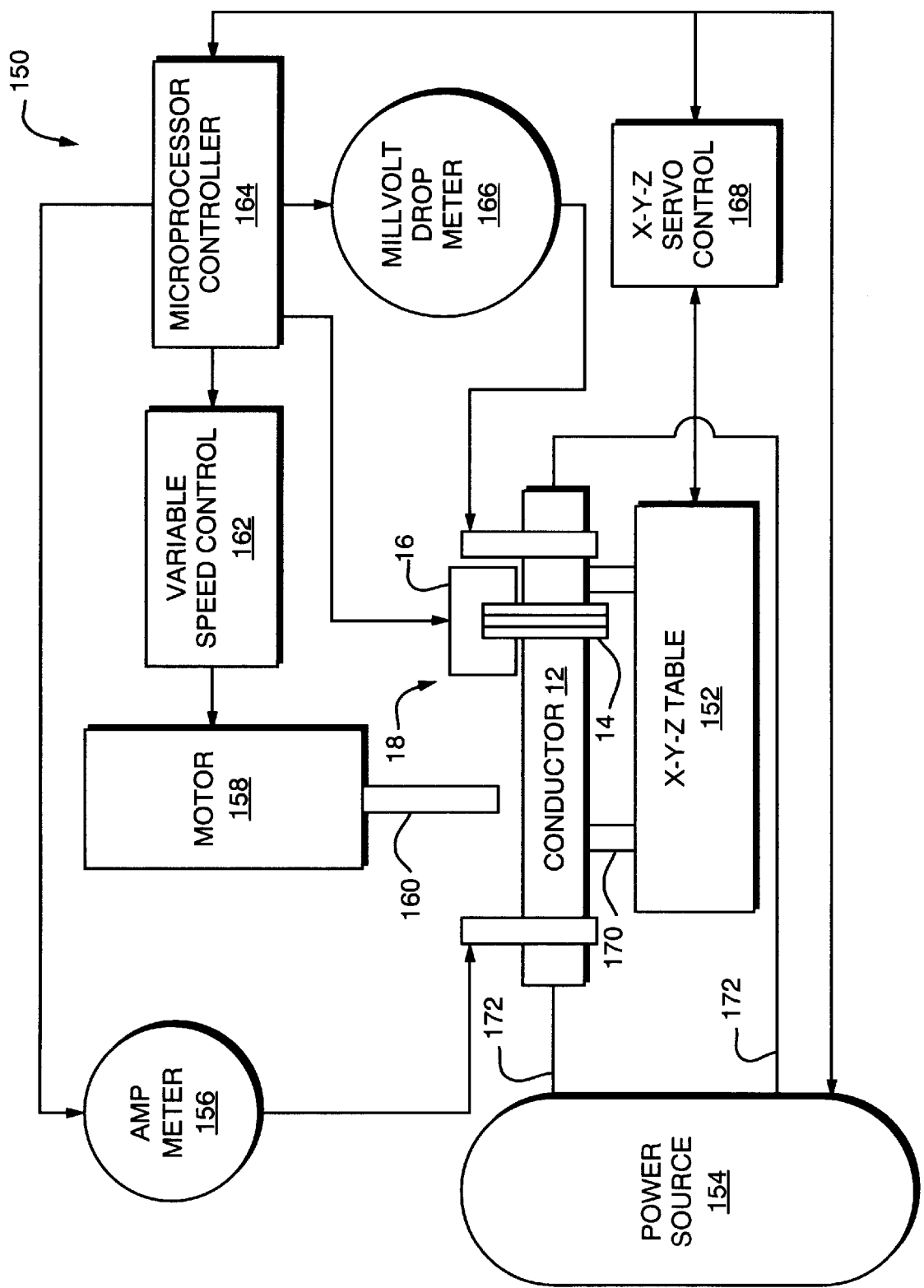
FIG. 6 is a schematic representation of an automated system for calibrating and trimming sensor configuration.

The trimming or calibration operation described above can be accomplished using an automated system such as that shown in FIG. 6. The automated trimming system 150 shown in FIG. 6 shows three subsystems. The power subsystem includes the power source 154, which is directly connected to the conductor 12 at each end by leads 172 and 170. The power source 154 is controlled by the controller 164.

The processing subsystem includes a controller 164 and associated input and output devices. Controller 164 is in communication with XYZ Servo Control 168. Controller 164 receives input from clamp-on ammeter 156 and the millivolt drop meter 166. Controller 164 also receives current information from the current sensor 18. Use of particularly the clamp-on ammeter 156 and the millivolts drop meter 166 is not part of the invention, as any person skilled in the art would recognize alternative means of measuring the current and voltage across conductor 12. These two devices send a constant flow of feedback information to the controller 164 so that the appropriate trimming program can be implemented. The selected trimming program is sent to the variable speed control 162. The variable speed control 162 drives variable speed motor 158. A variable speed motor will advantageously accommodate a variety of conductor materials and feed speeds. Attached to the motor 158 is a milling tool 160 by way of a rotating shaft.

The conductor-current transformer assembly is attached to the XYZ table 152 by way of an insulated fixture and conductor clamping apparatus 170. Insulated fixture and conductor clamping apparatus 170 is attached to the XYZ table and is made from materials selected for fixing and clamping that will simulate the conductor positioning of the electric device employed by the circuit breaker in which the current sensor-conductor assembly 10 will be installed.

Once the conductor 12 is attached to XYZ table 152 by insulated fixture and clamping apparatus 170, the inputs are installed and connected to controller 164. The CT output should be connected to controller 164 using an appropriate type of low resistance connector.

A preferred operation of the automated trimming system will now be described. First, the controller instructs power source 154 to direct 0.5X current through the conductor, X representing the rated current of the circuit breaker or other electric device in which the conductor will be used. Controller 164 then records the data from the meters as well as current sensor 18. Controller 164 next directs power source 154 to pass 2.0X current through conductor 12. Again, controller 164 will store data collected from the various inputs described above.

Controller 164 then calculates a trimming path to remove material from one of the conductor branches, reducing its cross-section area, thereby increasing its resistance and lowering the fraction of current carried by that conductor. The amount of material to be removed is determined based on the stored data, and will remove an amount of material that satisfies both the high and low levels of current, so that a desired fraction of the total current is sensed and reported by the current sensor. For example, if the current sensor measures 50 amperes of current, and the conductor-sensor has been calibrated to measure one-half the total current, then there should be a total of 100 amperes flowing through the conductor. This calculation will accommodate variations in the conductor as well as in the sensing electronics, including the transformer or other sensing device used.

Once trimming path is determined, the processor instructs motor 158 to rotate at a predetermined speed and instructs XYZ servo control 168 so that tool 160 follows the calculated trimming path. Referring to FIG. 1, the trimming path may remove some material from either or both areas 27 of conductor 12, indicated by the dashed line. Referring to FIG. 5, material from conductor 12 may be removed from either or both areas 54, also indicated by a dashed line. Material could also be removed from the conductor with a current sensor, to direct more current to non-sensed conductors. So long as material is removed from one conductor branch, and not from a point of a conductor downstream or upstream from where the branches are divided, the fraction of electrical current in all conductor branches will be varied as described above.

Controller 164 may be programmed to make two passes at conductor 12, the first being a "rough pass," staying away from the ideal trim target of the initial calculations. For example the initial trim path can be calculated to trim 5% shy of the mean target. In an alternative embodiment, the initial trim path is calculated to trim 25% shy of the mean target. The conductor can then be measured at the 2.0X level, 1.0X level, or both the 2.0X and 0.5X levels to confirm the final trimming parameters. This two-step process may be advantageous to prevent heat or other factors from the machining to affect the measurements.

So that an accurate trimming path can be calculated, the system can be informed of the edge of the conductor being trimmed by prior measurement of the conductor, or by a continuity reading between the cutter and the conductor, thus providing a feedback signal to the processor as to the exact location of the conductor with respect to the cutter.

During the actual trimming process, the controller may permit monitoring of the inputs to the processor in real-time, for example, by supplying a 0.005X current through conductor 12. After the final trim, the measurement is taken again at both levels of current (2.0X and 0.5X), and if in the target range, the assembly is marked or tagged as calibrated so it may be used in the product.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method for calibrating a current sensor having a conductor comprising at least two conductor branches electrically connected in parallel, comprising;
   passing a predetermined amount of electrical current through said conductor;
   passing a fraction of said electrical current through a measured conductor branch, which is one of said at least two branch conductors;
   determining a measured current by measuring said fraction of said electrical current using a current sensor;
   comparing said measured current against a predetermined target current;
   trimming a calibrating conductor branch, which is one of said at least two conductor branches, said trimming taking place when said measured current, as measured by said current sensor, is not within a predetermined acceptable error of a predetermined target current.

2. The method set forth in claim 1 wherein said trimming further comprises:
   calculating an amount of material to be removed being based on results of said comparing, and
   determining a trimming path of a milling tool to remove said amount of material from said one of the conductor branches.

3. The method set forth in claim 2 wherein said trimming further includes making a rough pass and a final pass, said rough pass calculated to remove a predetermined percentage of said amount of material.

4. The method set forth in claim 3 wherein said percentage is 95%.

5. The method set forth in claim 3 wherein said percentage is 75%.

6. The method set forth in claim 3 further comprising,
   passing an electrical current through said conductor after said rough pass, said rough pass altering the fraction of said electrical current that passes through the measured conductor branch thereby causing a new fraction of electrical current to pass through the measured conductor branch;
   measuring the new fraction of electrical current using said current sensor;
   calculating a final amount of material to be removed in said final pass based upon the new fraction of electrical current and
   determining a final trimming path of the milling tool to remove said final amount of material.

7. The method set forth in claim 1 wherein said measured conductor branch and said calibrating conductor branch are the same conductor branch.

8. The method set forth in claim 1 wherein said measured conductor branch and said calibrating conductor branch are different conductor branches.

9. The method set forth in claim 1 further comprising calculating a ratio of said electrical current that passes through said measured conductor by dividing an amount of said fraction of electrical current by an amount of said predetermined amount of electrical current; wherein said current sensor and said conductor are intended for an electrical device having a rating of a maximum approved current carrying capacity and said passing a predetermined electrical current includes passing an electrical current less than said rating and greater than said rating, and said step of measuring further includes calculating said ratio for each said electrical current less than said rating and greater than said rating, and averaging a set of resultant ratios.

10. The method set forth in claim 1 further comprising passing a monitoring current through said conductor and monitoring said measured current in real time during said trimming.

11. A current sensor configuration comprising:
   a conductor having at least two branch conductive paths connected in parallel;
   a current sensor arranged to sense current in one branch conductive path, said one branch conductive path carrying a fraction of a total current carried by said conductor, said current sensor providing a signal indicative of said sensed current, wherein one of said at least two branch conductive paths has been trimmed to adjust the fraction of a total current through said one branch conductive path until said signal indicates that said sensed current is a predetermined fraction of said total current to within a predetermined tolerance.

12. The current sensor configuration set forth in claim 11 wherein said current sensor comprises a current transformer.

13. The current sensor configuration set forth in claim 11 wherein said conductor comprises a solid conductor having an elongated aperture therethrough forming said two branch conductive paths.

14. The current sensor configuration set forth in claim 11 wherein said conductor comprises a conductor element and a bridge conductor connected at both ends to said conductor element.

15. An automated system for calibrating a current sensor comprising a conductor having at least two conductor branches, including a measured conductor branch and a calibrating conductor branch:

a controller;

an amp meter providing an output to said controller;

milling tool for milling a calibrating conductor branch;

a clamp supporting said conductor;

an XYZ servo control adapted to move said conductor relative to said milling tool;

a power source in communication with said controller for passing a current through said conductor.

16. The automated system of claim 15 wherein said controller is programmed to:

transmit a signal to said power source causing said power source to pass a predetermined electrical current through said conductor;

receive measured conductor branch current signals from a current sensor on said measured conductor branch to determine a fraction of said current that passes through the measured conductor branch;

compare said fraction against a predetermined target fraction;

transmit a signal to said XYZ servo control to cause the calibrating conductor branch to be trimmed by said milling tool; said trimming taking place when said determined fraction and said predetermined target fraction are not within a predetermined acceptable error.

17. The automated system set forth in claim 15 wherein said controller is further programmed to:

calculate an amount of material to be removed based on the fraction of the predetermined electrical current that passes through the measured conductor branch, and determine a trimming path of the milling tool to remove said amount of material from said calibrating conductor branch.

18. The automated system set forth in claim 17 wherein said controller is further programmed to transmit signals to said XYZ servo control to cause the milling tool to make a rough pass and a final pass, said rough pass calculated to remove a predetermined percentage of said amount of material.

19. The automated system set forth in claim 18 wherein said controller is further programmed to:

pass an electrical current through said conductor after said rough pass;

measure a new fraction of said electrical current passing through said measured conductor branch;

calculate a final amount of material to be removed in said final pass based upon the new fraction of said electrical current that passes through the measured conductor branch and determining a final trimming path of the milling tool to remove said final amount of material.

20. The automated system set forth in claim 15 wherein said measured conductor branch and said calibrating conductor branch are the same conductor branch.

21. The automated system set forth in claim 15 wherein said measured conductor branch and said calibrating conductor branch are different conductor branches.

22. The automated system set forth in claim 15 wherein said current sensor and said conductor are intended for an electrical device having a rating of a maximum approved current carrying capacity and said controller causes said power supply to pass a predetermined electrical current that is less than said rating and greater than said rating, and to measure said fraction for each said current less than said rating and greater than said rating, said controller then averaging the resultant fractions.

23. The automated system set forth in claim 15 wherein said controller is further programmed to pass a monitoring current through said conductor and to monitor said fraction of current in real time while said conductor is being trimmed.

* * * * *